US011584048B2

(12) United States Patent
Ogasawara

(10) Patent No.: US 11,584,048 B2
(45) Date of Patent: Feb. 21, 2023

(54) MOLDING APPARATUS, MOLDING METHOD, AND MANUFACTURING METHOD OF ARTICLE

(71) Applicant: CANON KABUSHIKI KAISHA, Tokyo (JP)

(72) Inventor: Masaki Ogasawara, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 274 days.

(21) Appl. No.: 16/687,390

(22) Filed: Nov. 18, 2019

(65) Prior Publication Data
US 2020/0171716 A1 Jun. 4, 2020

(30) Foreign Application Priority Data
Nov. 29, 2018 (JP) .............................. JP2018-224136

(51) Int. Cl.
*B29C 43/56* (2006.01)
*B29C 43/58* (2006.01)
*B29C 43/50* (2006.01)
B29C 43/32 (2006.01)

(52) U.S. Cl.
CPC .............. *B29C 43/56* (2013.01); *B29C 43/50* (2013.01); *B29C 43/58* (2013.01); B29C 2043/3233 (2013.01); B29C 2043/566 (2013.01)

(58) Field of Classification Search
None
See application file for complete search history.

(56) References Cited

U.S. PATENT DOCUMENTS

| 8,678,808 B2* | 3/2014 | Yoshida | B82Y 40/00 425/389 |
| 2012/0086149 A1* | 4/2012 | Yoshida | B82Y 40/00 264/293 |
| 2012/0199997 A1* | 8/2012 | Tanabe | B29C 43/56 264/82 |

FOREIGN PATENT DOCUMENTS

| JP | 2011-529626 A | 12/2011 |
| JP | 2013-38191 A | 2/2013 |
| JP | 2016-54232 A | 4/2016 |
| JP | 2016-157784 A | 9/2016 |

* cited by examiner

*Primary Examiner* — Mohammad M Ameen
(74) *Attorney, Agent, or Firm* — Canon U.S.A., Inc., IP Division

(57) ABSTRACT

An apparatus according to the present exemplary embodiment is an apparatus that forms a composition on a substrate using a mold. The apparatus includes a gas supply unit that supplies gas to a periphery of a space sandwiched between the mold and the substrate, a deforming mechanism that deforms the mold, and a control unit that, in a state in which the gas supply unit increases a density of the gas in the periphery of the space sandwiched between the mold and the substrate, after the deforming mechanism deforms the mold in a concave shape with respect to the substrate and releases the mold from the deformation, brings the mold into contact with the composition on the substrate.

10 Claims, 7 Drawing Sheets

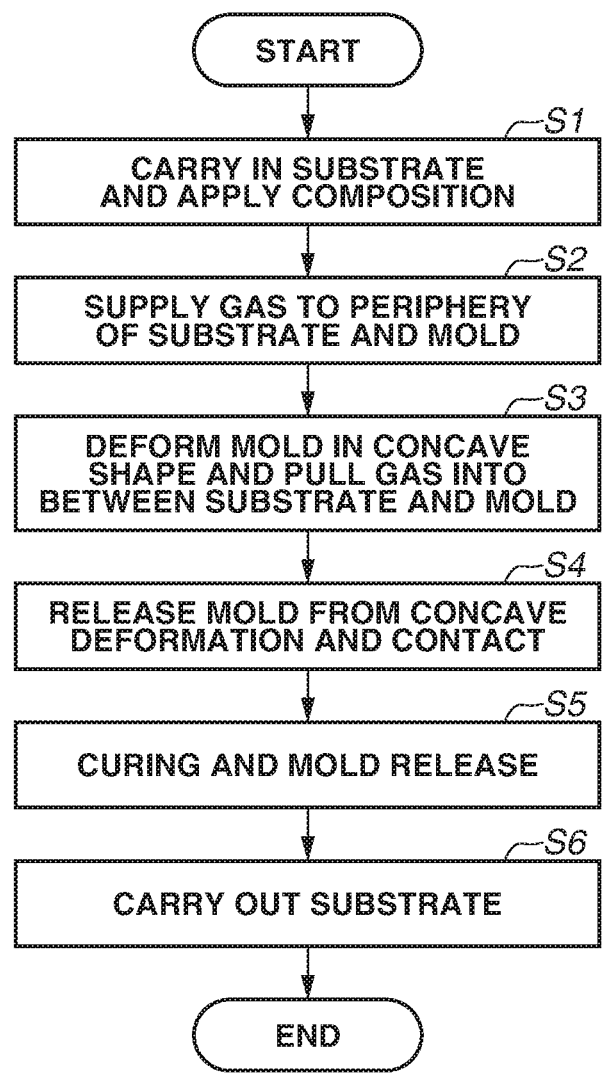

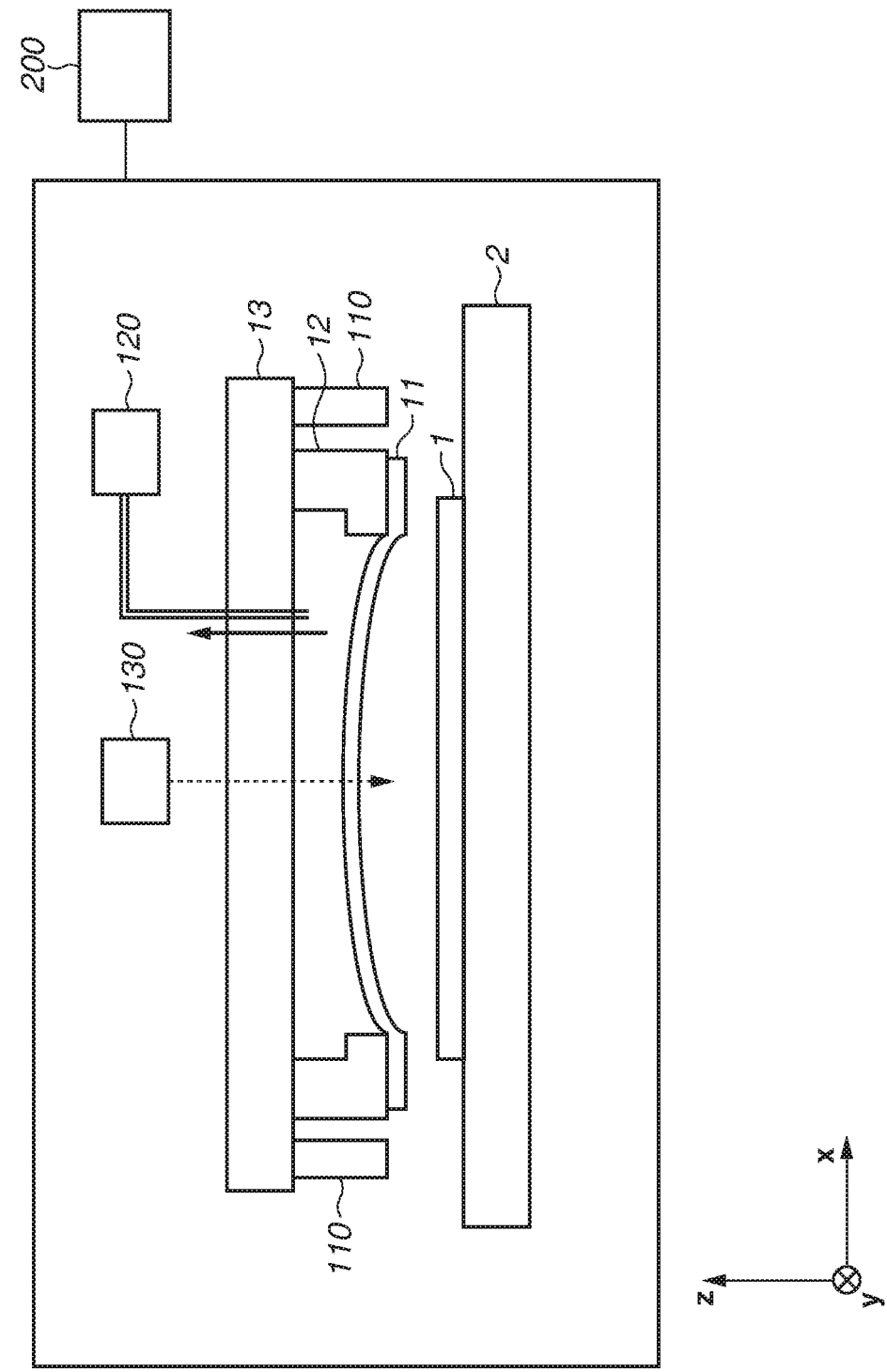

MOLDING APPARATUS, MOLDING METHOD, AND MANUFACTURING METHOD OF ARTICLE

BACKGROUND

Field of the Disclosure

The present disclosure relates to a molding apparatus, a molding method, and a manufacturing method of an article.

Description of the Related Art

As a method for manufacturing an article such as a semiconductor device or microelectronic mechanical systems (MEMS), there is known an imprint method for forming an imprint material on a substrate using a mold. In the imprint method, an uncured imprint material is supplied onto a substrate, and the supplied imprint material is brought into contact with a mold (imprinting). Then, after the imprint material is cured in a state in which the imprint material and the mold are in contact with each other, the mold is separated from the cured imprint material (mold release) to form a pattern of the imprint material on the substrate.

Furthermore, there is discussed a technique for flattening the surface of a substrate using an imprint technique in Japanese Unexamined Patent Application Publication (Translation of PCT Application) No. 2011-529626. As a technique for flattening the surface of a substrate, there is conventionally known a technique for flattening irregularity on the surface of the substrate by forming a coating film on the substrate using an existing coating apparatus (spin coater). However, this method is insufficient to flatten the irregularity on the surface of the substrate in a nanoscale order. On the other hand, according to the technology discussed in in Japanese Unexamined Patent Application Publication (Translation of PCT Application) No. 2011-529626, a polymerizable substance is supplied to a substrate based on irregularity on the substrate and is cured in contact with a template having a flat surface, thereby improving the accuracy of flattening.

In the imprint technology, when a mold is brought into contact with an imprint material on the substrate, gas with a high degree of solubility into the imprint material or gas with a high degree of diffusibility in the imprint material (hereinafter, referred to as process gas) is filled between the substrate and the mold to improve the filling property of the imprint material into the mold. A molding apparatus (flattening apparatus) may be used to flatten the entire surface of the substrate. Therefore, in the flattening apparatus, it is necessary to fill the process gas between the entire surface of the substrate and the mold. However, it is difficult to sufficiently fill the process gas because the gas filling range is wide.

Japanese Patent Laid-Open No. 2016-54232 discusses a method for improving the filling property of the process gas in an imprint apparatus by increasing the supply amount of the process gas when the distance between the substrate and the mold is to be increased. According to this method, however, the consumed amount of process gas increases, which may lead to a rise in the cost of operating the molding apparatus (imprint apparatus).

SUMMARY

According to an aspect of the present invention, a molding apparatus that molds a composition on a substrate using a mold includes a gas supply unit that supplies gas to a periphery of a space sandwiched between the mold and the substrate, a deforming mechanism that deforms the mold, and a control unit that, in a state in which the gas supply unit increases a density of the gas in the periphery of the space sandwiched between the mold and the substrate, after the deforming mechanism deforms the mold in a concave shape with respect to the substrate and releases the mold from the deformation, brings the mold into contact with the composition on the substrate.

Further features of the present invention will become apparent from the following description of exemplary embodiments with reference to the attached drawings.

BRIEF DESCRIPTION OF THE DRAWINGS

FIG. 3 is a flowchart illustrating a flattening process according to a first exemplary embodiment.

FIG. 4 is a diagram illustrating a flattening apparatus according to the first exemplary embodiment.

DESCRIPTION OF THE EMBODIMENTS

Figure 1:
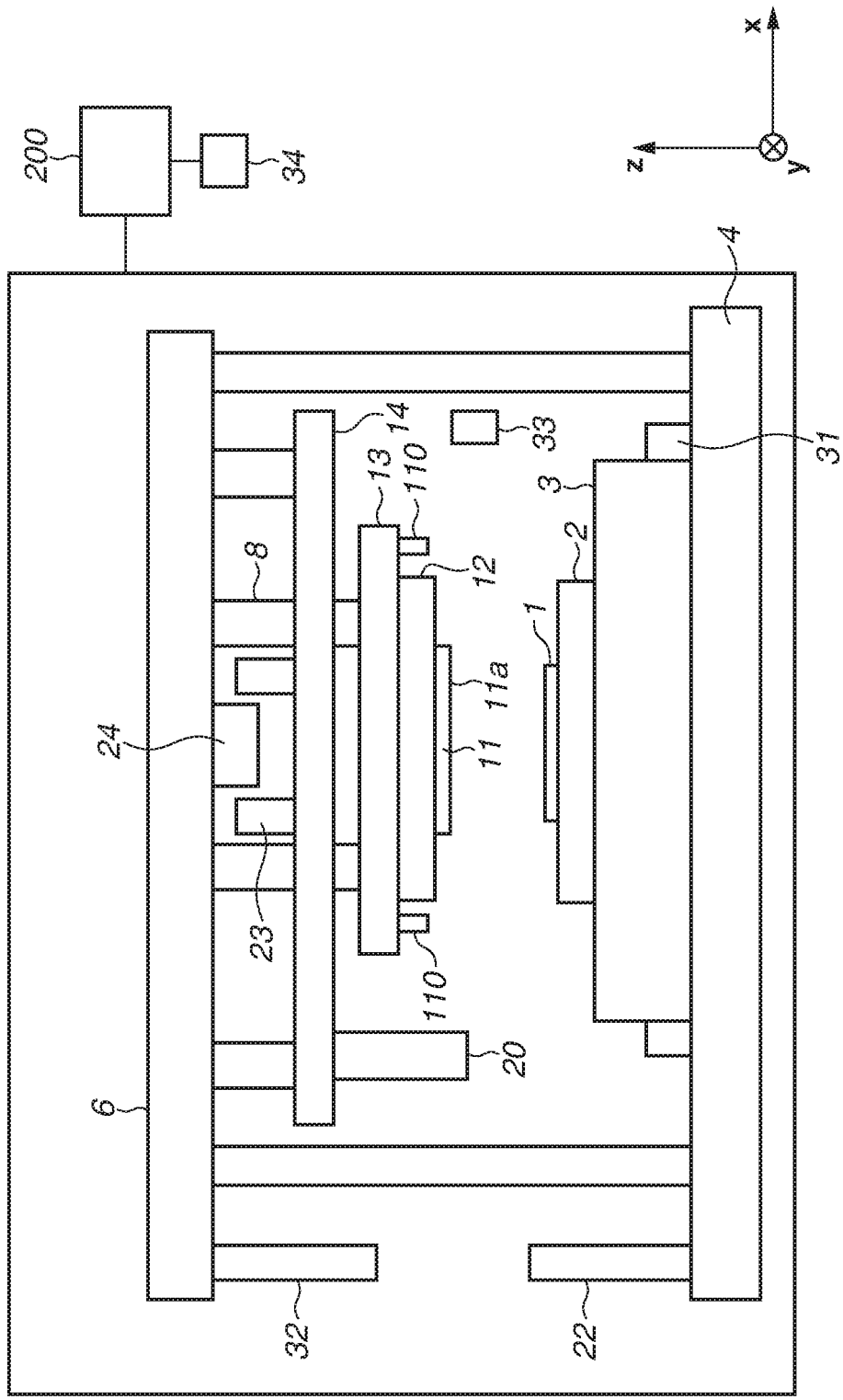
FIG. 1 is a schematic view illustrating a configuration of a flattening apparatus as one aspect of the present invention.

Exemplary embodiments of the present invention will be described in detail with reference to the attached drawings. In the drawings, the same members will be given the same reference numbers and duplicated descriptions thereof will be omitted.

FIG. 1 is a schematic diagram illustrating a configuration of a flattening apparatus 100 as a molding apparatus according to a first exemplary embodiment. The configuration of the flattening apparatus 100 will be described with reference to FIG. 1. In FIG. 1, a plane on which a substrate 1 is located is an XY plane and a direction orthogonal to the XY plane is a Z direction. The flattening apparatus 100 is embodied by a molding apparatus (i.e., imprint apparatus) that molds a composition on the substrate 1 using a mold 11 (sometimes referred to as a superstrate) having a planar portion 11a, and flattens the composition on the substrate 1. The flattening apparatus 100 is an apparatus that brings an uncured composition supplied on the substrate 1 into contact with a mold and applies curing energy to the composition in the contacted state to form the cured composition on the substrate. Then, the flattening apparatus 100 separates the mold from the cured composition to form a flat surface of the composition on the substrate. In the present exemplary embodiment, a flattening apparatus that cures an uncured composition by irradiating it with light will be described.

As illustrated in FIG. 1, the flattening apparatus 100 includes a chuck 2, a substrate stage 3, a base surface plate 4, a top plate 6, a guide bar 8, a mold holding unit 12, a head 13, and an alignment scope shelf 14. The flattening apparatus 100 further includes a supply unit 20, a substrate conveyance unit 22, an alignment scope 23, a light source 24, a stage drive unit 31, a mold conveyance unit 32, a cleaning unit 33, an input unit 34, a gas supply unit 110, and a control unit 200. In the flattening apparatus 100 illustrated in FIG. 1, the chuck 2 and the substrate stage 3 constitute a substrate holding unit that holds the substrate 1.

The substrate 1 is conveyed into the apparatus from the outside of the flattening apparatus 100 by the substrate conveyance unit 22 including a conveyance hand, and is held by the chuck 2. The chuck 2 holds the substrate 1 by suctioning the substrate 1, for example. For the substrate 1, glass, ceramics, metal, semiconductor, resin, or the like is used, and a member made of a material different from the substrate may be formed on the surface as necessary. Specifically, the substrate includes a silicon wafer, a compound semiconductor wafer, quartz glass, and the like.

The substrate stage 3 is supported by the base surface plate 4 and is movable in the X-axis direction and the Y-axis direction in order to position the substrate 1 held by the chuck 2 at a predetermined position. The stage drive unit 31 includes, for example, a linear motor and an air cylinder, and has a function of driving (moving) the substrate stage 3 at least in the X axis direction and the Y axis direction. Furthermore, the stage drive unit 31 may have a function of driving the substrate stage 3 in directions of two or more axes (e.g., six axial directions). The stage drive unit 31 may include a rotation mechanism and may have a function of rotationally driving (rotating) the chuck 2 or the substrate stage 3 around the Z axis.

The mold 11 is conveyed into the apparatus from the outside of the flattening apparatus 100 by the mold conveyance unit 32 including a conveyance hand, and is held by the mold holding unit 12. The mold 11 has, for example, a circular or square outer shape, and includes a planar portion 11a that contacts a composition on the substrate and follows the surface shape of the substrate 1. In this way, the mold 11 functions as a flattening member (also referred to as a superstrate) for flattening the composition in accordance with the surface shape of the substrate 1. In the present exemplary embodiment, the size of the planar portion 11a of the mold 11 is the same as that of the substrate 1 or larger than that of the substrate 1.

The mold holding unit 12 is supported by the head 13 and has a function of correcting the rotation direction of the mold 11 around the Z axis and the inclination of the mold 11 around the X axis and the Y axis. Each of the mold holding unit 12 and the head 13 includes an opening (not illustrated) that allows light (ultraviolet rays) emitted from the light source 24 through a collimator lens to pass therethrough. In addition, the mold holding unit 12 or the head 13 may have a load cell for measuring the pressing force (imprinting force) of the mold 11 applied to the composition on the substrate 1.

Support columns for supporting the top plate 6 are located on the base surface plate 4. The guide bar 8 is suspended from the top plate 6, passes through the alignment scope shelf 14, and is fixed to the head 13. The alignment scope shelf 14 is suspended from the top plate 6 via the support columns. The guide bar 8 passes through the alignment scope shelf 14. Further, the alignment scope shelf 14 has a height measurement system (not illustrated) for measuring the height (flatness) of the surface of the substrate 1 held by the chuck 2 using an oblique incident image shift method, for example.

The alignment scope 23 includes an optical system and an imaging system for observing a reference mark (not illustrated) provided on the substrate stage 3 and an alignment mark provided on the mold 11. The alignment scope 23 can measure the relative position between the reference mark provided on the substrate stage 3 and the alignment mark provided on the mold 11. The flattening apparatus 100 is used for alignment for correcting a misalignment of the substrate 1 and the mold 11 using the result of measurement by the alignment scope 23. However, if the substrate stage 3 has no reference mark and the mold 11 has no alignment mark, the alignment scope 23 may not be provided.

The supply unit 20 is formed of a dispenser that includes a supply port (discharge port, nozzle) for supplying an uncured composition to the substrate 1. The supply unit 20 can supply (apply) an uncured composition to a desired region on the substrate 1. The supply unit 20 can supply a composition having a minute volume of about one picoliter (pL) onto the substrate 1 by a piezo jet method or a micro solenoid method, for example. Further, the number of supply ports in the supply unit 20 is not limited, and may be one (single nozzle) or may exceed 100 (i.e., may be a linear nozzle array or a combination of a plurality of linear nozzle arrays).

The composition is a liquid organic material and includes a conventional imprint material. Specifically, as the composition, a curable composition that is cured by giving energy for curing (which may also be referred to as an uncured resin) is used. As the energy for curing, electromagnetic waves, heat, or the like is used. As the electromagnetic waves, for example, light is used such as infrared rays, visible rays, and ultraviolet rays of which the wavelength is selected from a range of 10 nm to 1 mm.

The curable composition refers to a composition that cures by light irradiation or by heating. The photocurable composition that is cured by light irradiation contains at least a polymerizable compound and a photopolymerization initiator, and may contain a non-polymerizable compound or a solvent as necessary. The non-polymerizable compound is at least one selected from the group consisting of a sensitizer, a hydrogen donor, an internal release agent, a surfactant, an antioxidant, and a polymer component.

The composition may be applied on the substrate in the form of a film by a spin coater or a slit coater. The composition may be applied by a liquid ejecting head onto the substrate in the form of droplets, or in the form of islands or films formed by connecting a plurality of droplets. The viscosity of the composition (viscosity at 25° C.) is, for example, from 1 mPa·s to 100 mPa·s.

The cleaning unit 33 cleans the mold 11 held by the mold holding unit 12. After the mold 11 is separated from the cured composition on the substrate 1, the cleaning unit 33 can remove the remaining composition attached to the mold 11 (particularly, the planar portion 11a). The cleaning unit 33 may be, for example, a mechanism for wiping off the composition attached to the mold 11, or may remove the composition attached to the mold 11 using UV irradiation, wet cleaning, dry plasma cleaning, or the like. The cleaning unit 33 may clean the mold 11 removed from the mold holding unit 12.

The gas supply unit 110 supplies gas having a high degree of solubility in the composition or gas having a high degree of diffusibility in the composition, into between the substrate 1 and the mold 11. When the gas supply unit 110 supplies the gas, the filling property of the composition into the mold 11 can be improved at the time of bringing the composition on the substrate 1 into contact with the mold 11.

The control unit 200 includes a CPU, a memory, and the like, and controls the entire flattening apparatus 100. The control unit 200 functions as a processing unit that performs a flattening process by comprehensively controlling the operations of units of the flattening apparatus 100. In this case, the flattening process is to flatten the uncured composition by bringing the planar portion 11a of the mold 11 into contact with the composition on the substrate 1 and causing the planar portion 11a to follow the surface shape of the substrate 1. The flattening process is generally performed on a lot basis, that is, on each of a plurality of substrates included in the same lot. The control unit 200 may be provided in the flattening apparatus 100, or may be installed at a location different from the flattening apparatus 100 and controlled remotely. The flattening apparatus 100 may be provided with an input unit 34. The input unit 34 is a device that inputs conditions for the operation of the flattening apparatus 100 to the control unit 200.

Figure 2A:
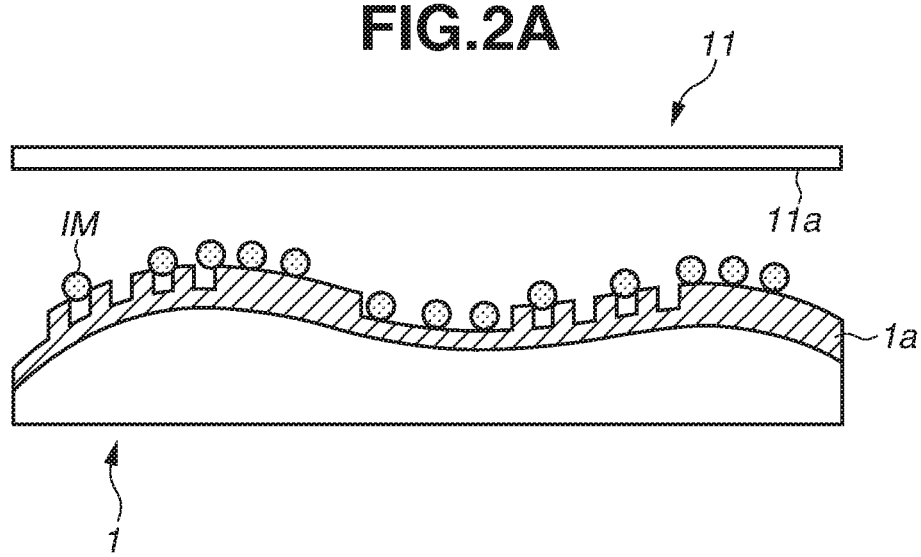
FIGS. 2A, 2B, and 2C are diagrams illustrating an outline of a flattening process.
Figure 2B:
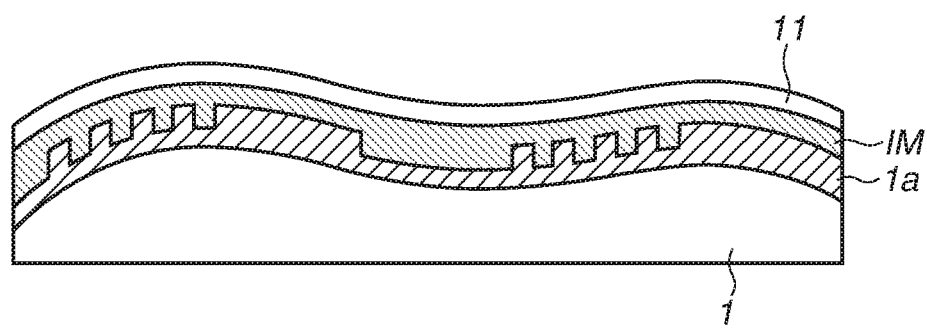
Figure 2C:
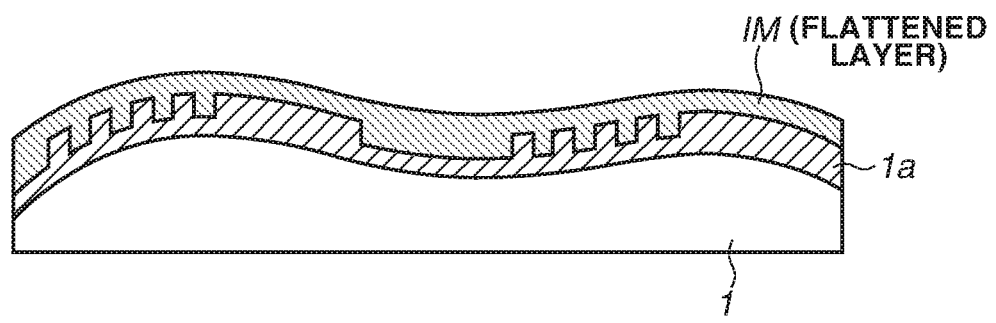

FIGS. 2A to 2C are diagrams illustrating an outline of the flattening process as a molding method. The outline of the flattening process will be described with reference to FIGS. 2A to 2C. First, as illustrated in FIG. 2A, a composition IM is supplied from the supply unit 20 to the substrate 1 on which a base pattern 1a is formed. The supply unit 20 can apply the composition with a distribution of the supply amount of the composition IM (differences in supply amount) based on unevenness formed on the base pattern 1a. FIG. 2A illustrates a state in which the composition IM is supplied onto the substrate 1 and the mold 11 is not brought into contact with the composition IM yet.

Next, as illustrated in FIG. 2B, the flattening apparatus 100 brings the composition IM on the substrate 1 into contact with the planar portion 11a of the mold 11. FIG. 2B illustrates a state in which the planar portion 11a of the mold 11 comes into contact with the composition IM on the substrate 1, and the planar portion 11a of the mold 11 follows the surface shape of the substrate 1. Then, in the state illustrated in FIG. 2B, the flattening apparatus 100 irradiates the composition IM on the substrate with light from the light source 24 through the mold 11 to cure the composition IM.

Next, the flattening apparatus 100 pulls the mold 11 away from the cured composition IM on the substrate 1 as illustrated in FIG. 2C. Accordingly, a layer (flattened layer) of the composition IM having a uniform thickness can be formed on the entire surface of the substrate 1. FIG. 2C illustrates a state in which a flattened layer of the composition IM following the shape of surface of the substrate 1 is formed on the substrate 1.

The flattening apparatus and flattening process according to the first exemplary embodiment will be described with reference to FIGS. 3 and 4. FIG. 3 is a flowchart illustrating the flattening process in the flattening apparatus 100 according to the first exemplary embodiment. FIG. 4 is a diagram illustrating a part of the flattening apparatus 100 according to the first exemplary embodiment.

A method for the flattening process according to the first exemplary embodiment will be described with reference to the flowchart illustrated in FIG. 3. When the flattening process is started, in step S1, a substrate is carried into the flattening apparatus 100, the substrate conveyance unit 22 conveys the substrate 1 onto the chuck 2, and the supply unit 20 applies the composition onto the substrate 1. The mold 11 is preferably conveyed by the mold conveyance unit 32 to the mold holding unit 12 before the substrate is carried in. Further, the substrate 1 on which the composition has been previously supplied may be carried into the flattening apparatus 100.

Next, in step S2, in order to supply process gas between the substrate 1 and the mold 11, the gas supply unit 110 first supplies the process gas (gas) around the substrate 1 and the mold 11. The process gas supplied at this time is desirably a highly diffusible gas such as helium gas in order to enhance the filling property of the composition into the mold. Otherwise, the process gas may be nitrogen gas or the like for the purpose of excluding oxygen from the atmosphere between the substrate 1 and the mold 11.

Next, in step S3, in order to sufficiently fill the process gas between the substrate 1 and the mold 11, the planar portion 11a of the mold 11 is deformed in a concave shape with respect to the substrate 1 like the shape of the mold 11 illustrated in FIG. 4. The mold 11 is deformed by applying mechanical stress, for example. After supplying the process gas in step S2, by deforming the mold 11 into a concave shape in step S3, the volume of the space sandwiched between the mold 11 and the substrate 1 increases, whereby the pressure in the space decreases (vacuum is generated). Accordingly, an action of drawing the surrounding process gas into the space between the mold 11 and the substrate 1 works so that the space between the mold 11 and the substrate 1 can be sufficiently filled with the process gas. At this time, the space sandwiched between the mold 11 and the substrate 1 does not necessarily need to be replaced with the process gas as far as the space is in a state in which the ratio of the process gas mixed in the atmosphere is increased and the concentration of the gas is high (the density of the gas is high).

Next, in step S4, the mold 11 is released from the concave deformation, and the mold 11 and the composition on the substrate 1 are brought into contact (imprinted). When the mold and the composition are brought into contact with each other, the shape of the planar portion 11a of the mold 11 may be flat or may be deformed into a convex shape with respect to the substrate 1. At this time, even when the mold 11 is released from the deformation, the space sandwiched between the mold 11 and the substrate 1 is maintained in a state in which the concentration of the process gas is high (the density of the gas is high).

Next, in step S5, after the composition is cured by irradiation with light from the light source 24, the mold 11 is separated from the cured composition (mold release), whereby the formation of the flattened layer is completed. Finally, in step S6, the flattening process is performed by the substrate conveyance unit 22, and the substrate 1 with the flattened layer is carried out from the chuck 2, whereby the flattening process is completed. The above described steps are repeated for each substrate that needs to be flattened.

The flattening apparatus 100 includes a pressure control unit 120 as a deforming mechanism to deform the mold 11 into a concave shape or a convex shape in steps S3 and S4. Referring to FIG. 4, the flattening apparatus 100 including the pressure control unit 120 will be described. The pressure control unit 120 is configured to adjust the pressure in the space formed by the mold 11, the mold holding unit 12, and the head 13. A vacuum pump or the like can be used for the pressure control unit 120. The space formed by the mold 11, the mold holding unit 12, and the head 13 is a space above the mold 11, on the opposite side of the substrate 1 held by the chuck 2. The pressure control unit 120 can deform the mold 11 into a convex shape by making the pressure in the space on the opposite side of the planar portion 11a of the mold 11 larger than the atmosphere, or can deform the mold 11 into a concave shape by making the pressure smaller than the atmosphere.

Further, the pressure control unit 120 may be connected to a negative pressure source supplied from a facility different from the flattening apparatus 100. Further, the pressure control unit 120 may include an electromagnetic valve, an air operated valve, or the like in order to adjust the pressure in the space on the opposite side of the planar portion 11a of the mold 11. Furthermore, the pressure control unit 120 may include a regulator, a mass flow controller, a speed controller, or the like for the purpose of adjusting the pressure. With the pressure control unit 120, the mold 11 can be deformed into a concave shape with respect to the substrate 1 by setting the space to have a negative pressure. The value of the negative pressure is desirably adjusted with a regulator or the like so that the effect of pulling in the process gas supplied to the periphery of the mold 11 in step S2 can be sufficiently obtained. In addition, it is desirable to adjust the pressure value so that the deformation amount of the mold 11 is not too large to cause breakage. FIG. 4 is a diagram illustrating a case where the pressure control unit 120 deforms the mold 11 into a concave shape by making the pressure in the space smaller than the atmospheric pressure in step S3.

In order to efficiently increase the density of the process gas in the space sandwiched between the mold and the substrate, after the gas is supplied to the periphery of the mold while the deforming mechanism deforms the mold 11 into a convex shape, the planar portion 11a of the mold 11 may be returned to a flat shape or may be deformed into a concave shape. For example, while the process gas is supplied in step S2, the deforming mechanism deforms the mold 11 into a convex shape, and then deforms the mold 11 into a concave shape in step S3. As described above, the flattening apparatus 100 deforms the mold 11 once into a convex shape before bringing the mold 11 into contact with the composition IM, and then deforms the mold 11 into a concave shape, thereby increasing the density of the process gas in the space sandwiched between the mold and the substrate.

The flattening apparatus 100 may include a gas detection unit 130 to detect that the process gas is filled in the space sandwiched between the mold 11 and the substrate 1 in step S3. Referring to FIG. 4, the flattening apparatus 100 including the gas detection unit 130 will be described. The gas detection unit 130 can detect that the process gas supplied from the gas supply unit 110 is filled in the space between the mold 11 and the substrate 1. For the gas detection unit 130, a laser displacement meter or the like can be used. As illustrated in FIG. 4, the laser displacement meter is disposed on the mold holding unit 12 side with respect to the mold 11, and can measure the distance to the substrate 1 through the mold 11. The laser displacement meter can measure the distance to the substrate using laser light that has passed through the space between the mold and the substrate. In general, in the flattening apparatus 100, helium gas is often used as the process gas. Helium gas has a refractive index different from that of air (atmosphere). Thus, when the process gas is filled between the mold 11 and the substrate 1, the measurement value of the laser displacement meter changes. In this manner, the gas detection unit 130 can detect that the process gas is filled by the change in the measurement value of the laser displacement meter. Since the process gas is filled from the periphery to the center of the substrate 1, the place of measurement by the laser displacement meter is desirably the center of the substrate 1 (the mold 11).

Figure 5:
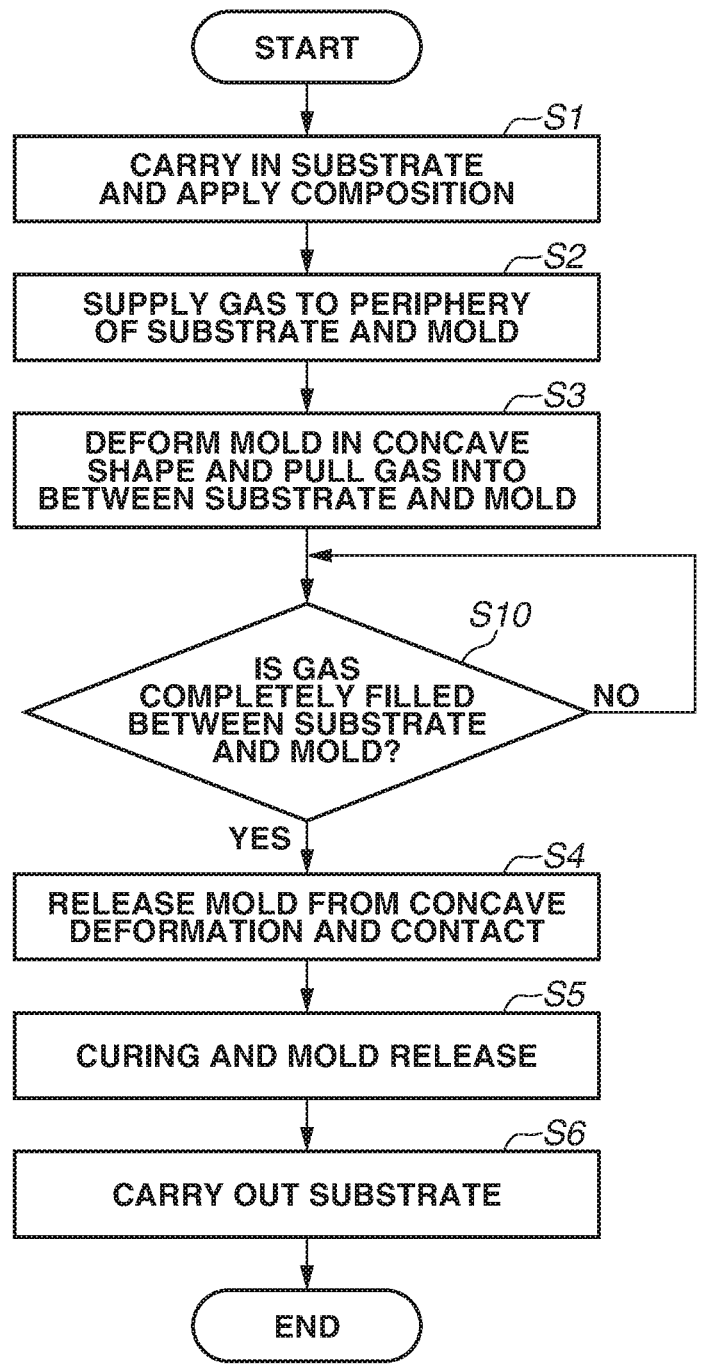
FIG. 5 is a flowchart illustrating a flattening process according to a second exemplary embodiment.

Next, a flattening process as a molding method according to a second exemplary embodiment will be described with reference to FIG. 5. FIG. 5 is a flowchart illustrating the flattening process in a flattening apparatus 100 according to the second exemplary embodiment. In the flowchart of FIG. 5, the description of the same steps as those in the flowchart of FIG. 3 is omitted.

The flattening process according to the second exemplary embodiment includes step S10 of determining whether process gas is filled between the substrate 1 and the mold 11 from the measurement value of the gas detection unit 130 after the mold 11 is deformed into a concave shape in step S3. The determination whether the process gas is filled is performed by the control unit 200 illustrated in FIG. 1. The control unit 200 determines the filling of the process gas by determining whether the measurement value of the gas detection unit 130 exceeds a desired value.

When it is determined in step S10 that the filling of the process gas between the substrate and the mold is completed, the processing proceeds to next step S4 and continues the flattening process described in FIG. 3. On the other hand, when it is determined in step S10 that the process gas is not sufficiently filled between the substrate and the mold (the filling is not completed), the progressing waits until the gas filling is completed. At this time, an additional step (not illustrated) may be performed in which a time for stopping is limited, and when filling is not completed within a predetermined time, this is regarded as an abnormality in the apparatus and the processing stops. If the gas filling is insufficient, the head 13 may be raised in the + direction of the Z axis, and an additional step may be carried out to promote the effect of pulling in the process gas by increasing the distance between the substrate 1 and the mold 11.

Figure 6:
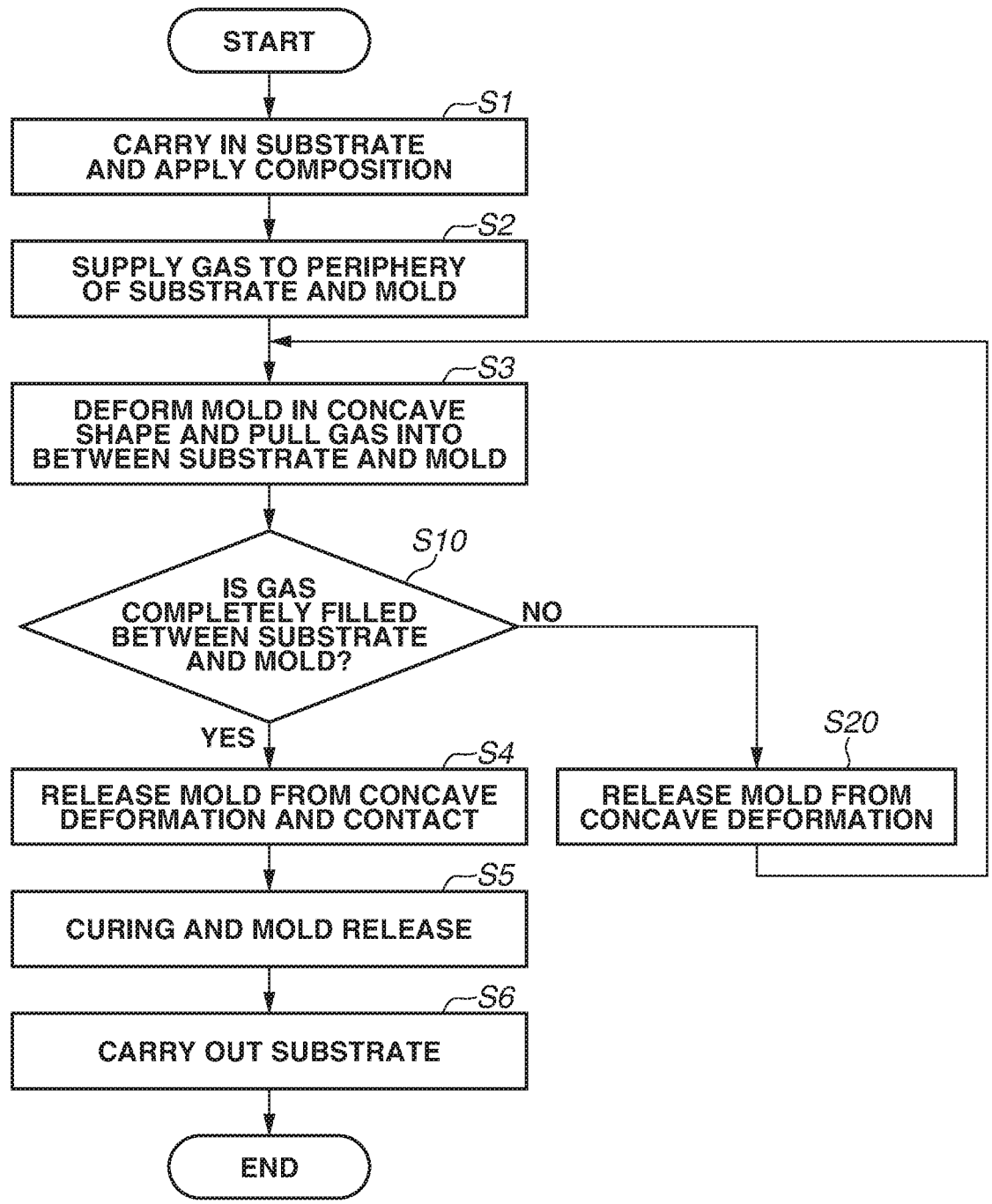
FIG. 6 is a flowchart illustrating a flattening process according to a third exemplary embodiment.

Next, a flattening process as a molding method according to a third exemplary embodiment will be described with reference to FIG. 6. FIG. 6 is a flowchart illustrating the flattening process in a flattening apparatus 100 of the third exemplary embodiment. In the flowchart of FIG. 6, the description of the same steps as those in the flowcharts of FIGS. 3 and 5 is omitted.

In the flattening process according to the third exemplary embodiment, after the mold 11 is deformed into a concave shape in step S3, when it is determined that the process gas is not sufficiently filled between the substrate 1 and the mold 11, the mold 11 is released from the concave deformation in step S20. Releasing of the mold 11 from the concave deformation is performed by the pressure control unit 120 controlling the pressure in the space on the opposite side of the planar portion 11a of the mold 11. For example, the mold 11 is released from the concave deformation by cutting off the negative pressure supplied from the pressure control unit 120. The shape (planar portion 11a) of the mold 11 after the release from concave deformation in step S20 may be flat with respect to the substrate 1 or may be convex.

After releasing the mold 11 from the concave deformation in step S20, the step of pulling in the process gas around the mold 11 (step S3) is performed by deforming the mold 11 again into a concave shape with respect to the substrate 1. At this time, an additional step (not illustrated) may be provided in which the number of times of releasing the mold 11 from the concave deformation is limited, and when the filling is not completed within a predetermined number of times, this is regarded as an abnormality in the flattening apparatus 100 and the flattening process may be stopped. If the gas filling is insufficient, the head 13 may be raised in the + direction of the Z axis, and an additional step may be carried out to promote the effect of pulling in the process gas by increasing the distance between the substrate 1 and the mold 11.

When it is determined in step S10 that the gas filling is not completed, the mold may be released from the concave deformation, and the processing may return to step S2 to supply the process gas again to the periphery of the mold 11. Then, after supplying the process gas, the mold 11 may be deformed into a concave shape in step S3. Further, step S2 and step S3 may be performed simultaneously in at least a part of the period.

In the above-described exemplary embodiment, as the molding apparatus, the flattening apparatus 100 that flattens the composition on the substrate using the flat plate called a superstrate having the planar portion 11a with no pattern as the mold 11 has been described. However, the molding apparatus is not limited to a flattening apparatus but may be an imprint apparatus that forms a pattern on an imprint material on a substrate using a mold having a pattern portion on which a concave-convex pattern is formed.

In this case, the mold 11 is a mold for molding the imprint material on the substrate. The mold can also be called a template or an original. The mold 11 has a rectangular outer shape and has a pattern surface (first surface) on which a pattern (concave-convex pattern) to be transferred to (the imprint material of) the substrate 1 is formed. The mold 11 is made of a material that transmits ultraviolet light for curing the imprint material on the substrate, for example, quartz. Mold-side marks serving as alignment marks are formed on the pattern surface of the mold 11.

The flattening apparatus and the imprint apparatus as the molding device use the photocuring method to cure the composition and the imprint material as described above. However, in any of the exemplary embodiments, the composition and the imprint material may be cured by using not only the photocuring method but also a method with heat application.

In the photocuring method, a pattern is formed by using an ultraviolet curable resin, curing the resin by application of ultraviolet rays in a state in which the mold is pressed against the substrate through the resin, and then separating the mold from the cured resin. In the exemplary embodiments described above, ultraviolet rays are applied as the curing light, but the wavelength of the light can be appropriately determined depending on the composition or imprint material supplied onto the substrate 1.

On the other hand, in the method with heat application, a pattern is formed by heating the thermoplastic resin to a temperature equal to or higher than the glass transition temperature, pressing the mold against the substrate through the resin in a state in which the fluidity of the resin is increased, cooling the resin, and then separating the mold from the resin.

Further, a cured material pattern may be formed on a substrate with the surface being flattened by the flattening apparatus 100 as illustrated in FIG. 2C, using an imprint apparatus. Hereinafter, a method for forming a cured material pattern on a substrate using an imprint apparatus will be described.

The pattern of the cured material formed using the imprint apparatus is used permanently for at least a part of various articles or is temporarily used for manufacturing various articles. The articles are electric circuit elements, optical elements, microelectronic mechanical systems (MEMS), recording elements, sensors, or molds. Examples of the electric circuit elements include volatile or nonvolatile semiconductor memories such as a dynamic random-access memory (DRAM), a static random access memory (SRAM), a flash memory, and a magnetic random access memory (MRAM), and semiconductor elements such as a large scale integrated circuit (LSI), a charge-coupled device (CCD), an image sensor, and a field programmable gate array (FPGA). Examples of the mold include a replica mold for imprinting.

The pattern of the cured material is used as it is as a constituent member of at least a part of the article or is temporarily used as a resist mask. After etching, ion implantation, or the like in the substrate processing step, the resist mask is removed.

Figure 7A:
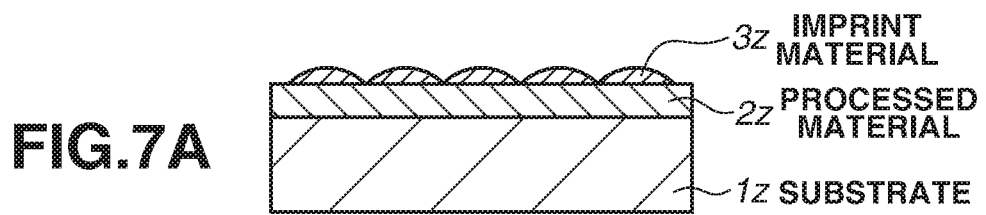
FIGS. 7A, 7B, 7C, 7D, 7E, and 7F are diagrams illustrating a manufacturing method of an article.

Next, a specific manufacturing method of an article will be described. As illustrated in FIG. 7A, a substrate 1z such as a silicon wafer on which a processed material 2z such as an insulating material is formed is prepared, and then an imprint material 3z is applied on the surface of the processed material 2z by an inkjet method or the like. In FIG. 7A, a state in which the imprint material 3z in the form of a plurality of droplets is applied on the substrate is illustrated.

Figure 7B:
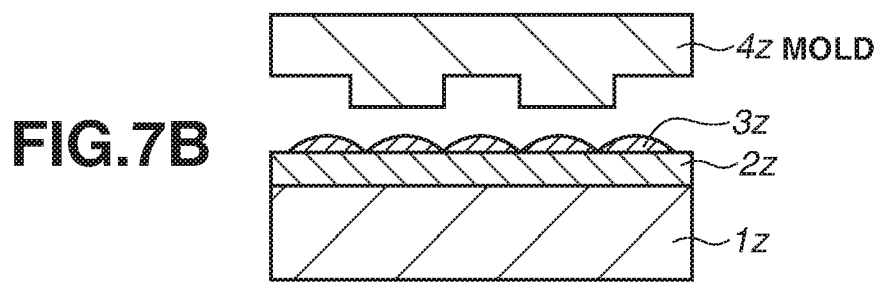
Figure 7C:
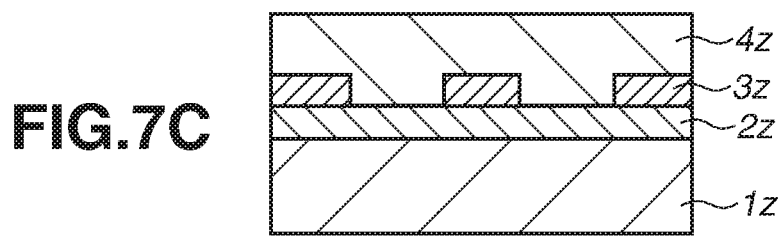

As illustrated in FIG. 7B, an imprint mold 4z is positioned so that the side with a concave-convex pattern is opposed to the imprint material 3z on the substrate. As illustrated in FIG. 7C, the substrate 1z provided with the imprint material 3z is brought into contact with the mold 4z, and pressure is applied. The imprint material 3z is filled in the gap between the mold 4z and the processed material 2z. In this state, when light is applied as curing energy through the mold 4z, the imprint material 3z is cured.

Figure 7D:
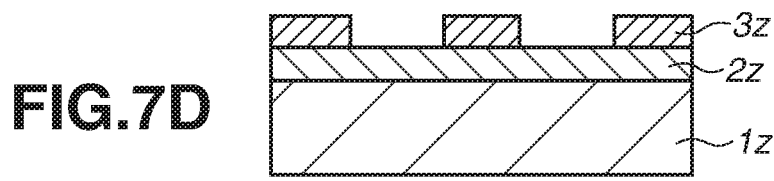

As illustrated in FIG. 7D, after the imprint material 3z is cured, when the mold 4z and the substrate 1z are separated, a cured material pattern of the imprint material 3z is formed on the substrate 1z. This cured material pattern has a shape in which the concave portion of the mold corresponds to the convex portion of the cured material, and the convex portion of the mold corresponds to the concave portion of the cured material. Thus, the concave-convex pattern of the mold 4z is transferred to the imprint material 3z.

Figure 7E:
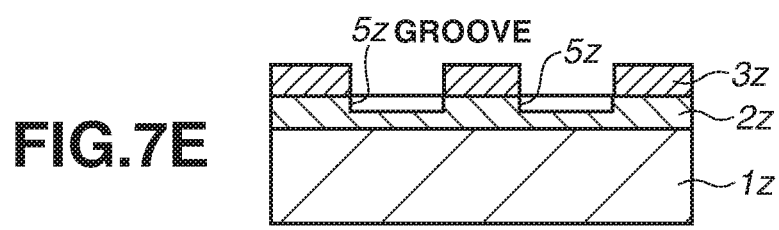
Figure 7F:
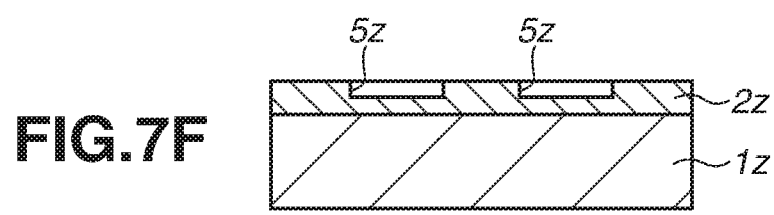

As illustrated in FIG. 7E, when etching is performed using the pattern of the cured material as an etching resistant mask, portions of the surface of the processed material 2z where the cured material is not present or remains thin are removed to form grooves 5z. As illustrated in FIG. 7F, when the pattern of the cured material is removed, an article with the grooves 5z formed on the surface of the processed material 2z can be obtained. In this example, the cured material pattern is removed. Alternatively, the cured material pattern may not be removed after the processing but may be used as a film for inter-layer insulation included in the semiconductor device or the like, that is, as a constituent element of the article.

While preferable exemplary embodiments of the present invention have been described above, the present invention is not limited to these exemplary embodiments but various modifications and changes can be made within the gist of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-224136, filed Nov. 29, 2018, which is hereby incorporated by reference herein in its entirety.

What is claimed is:

1. An apparatus that forms a composition on a substrate using a superstrate, comprising:
 a gas supply unit configured to supply gas to a periphery of a space sandwiched between the superstrate and the substrate;
 a deforming mechanism configured to deform the superstrate, wherein the deforming mechanism includes a pressure control unit for deforming the superstrate by controlling pressure in a space opposite to the substrate; and
 a controller configured to perform control in a following order:

(1) causing the gas supply unit to supply the gas such that a density of the gas in the periphery of the space sandwiched between the superstrate and the substrate is increased;

(2) reducing pressure in the space by the pressure control unit to deform mold the superstrate such that a central part of the superstrate is separated from the substrate more than a peripheral part of the superstrate in a state that the superstrate is not in contact with the composition on the substrate;

(3) increasing pressure in the space by the pressure control unit to deform the superstrate such that a central part of the superstrate is closer to the substrate than a peripheral part of the superstrate in a state that the superstrate is not in contact with the composition on the substrate; and (4) bringing the superstrate in contact with the composition on the substrate in a state that the superstrate is deformed so that the central part of the superstrate is closer to the substrate than the central part of the superstrate.

2. The apparatus according to claim 1, further comprising a superstrate holding unit that holds the superstrate, wherein the pressure control unit adjusts a pressure in a space opposite to the substrate with respect to the superstrate held by the superstrate holding unit, and sets the space to have a negative pressure by the pressure control unit to deform the superstrate into the concave shape.

3. The apparatus according to claim 1, further comprising a gas detection unit configured to detect whether the gas is supplied in the space sandwiched between the superstrate and the substrate.

4. The apparatus according to claim 3, wherein the gas detection unit is a laser displacement meter, and wherein the laser displacement meter measures a distance to the substrate using laser light that has passed through the space between the superstrate and the substrate, and determines whether the gas is filled in the space between the superstrate and the substrate from a change in the measurement value.

5. The apparatus according to claim 3, wherein the gas detection unit measures whether the gas is filled in a space sandwiched between a center of the superstrate and the substrate.

6. The apparatus according to claim 3, wherein the deforming mechanism releases the superstrate from the deformation to bring the superstrate into contact with the composition on the substrate after the gas detection unit detects that the gas is filled in the space sandwiched between the superstrate and the substrate.

7. The apparatus according to claim 1, wherein the gas is helium gas.

8. The apparatus according to claim 1, wherein the apparatus flattens the composition on the substrate by using a flat plate having a planar portion as the superstrate.

9. The apparatus according to claim 1, wherein the apparatus forms a pattern of the composition on the substrate by using the superstrate with a concave-convex pattern.

10. The apparatus according to claim 1, wherein the controller causes the deforming mechanism to deform the superstrate into the concave shape with respect to the substrate, in a state in which the deforming mechanism deforms the superstrate into a convex shape with respect to the substrate and the gas supply unit increases the density of the gas in the periphery of the space sandwiched between the superstrate and the substrate.

* * * * *